(12) United States Patent
You et al.

(10) Patent No.: US 10,685,939 B2
(45) Date of Patent: Jun. 16, 2020

(54) WHITE LIGHT EMITTING DIODE MODULE AND LIGHTING APPARATUS (71) Applicant: SAMSUNG ELECTRONICS CO., LTD., Suwon-si, Gyeonggi-do (KR)

(72) Inventors: Jae Sung You, Osan-si (KR); Yun Tae Hwang, Seoul (KR); Ho Young Song, Suwon-si (KR); Won Hoe Koo, Seoul (KR); Jae Chul Kim, Suwon-si (KR); Ho Sun Paek, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/243,363

(22) Filed: Jan. 9, 2019

(65) Prior Publication Data
US 2019/0371768 A1 Dec. 5, 2019

(30) Foreign Application Priority Data
Jun. 4, 2018 (KR) .................. 10-2018-0064114

(51) Int. Cl.
| | |
|---|---|
| *H01L 25/075* | (2006.01) |
| *F21V 23/00* | (2015.01) |
| *H01L 33/54* | (2010.01) |
| *F21V 29/70* | (2015.01) |
| *H01L 33/60* | (2010.01) |
| *H01L 33/50* | (2010.01) |
| *F21Y 115/10* | (2016.01) |
| *H01L 33/62* | (2010.01) |
| *H05B 45/20* | (2020.01) |

(52) U.S. Cl.
CPC ........ *H01L 25/0753* (2013.01); *F21V 23/003* (2013.01); *F21V 29/70* (2015.01); *F21Y 2115/10* (2016.08); *H01L 33/507* (2013.01); *H01L 33/54* (2013.01); *H01L 33/60* (2013.01); *H01L 33/62* (2013.01); *H01L 2933/0091* (2013.01); *H05B 45/20* (2020.01)

(58) Field of Classification Search
None
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| (Continued) | | |

FOREIGN PATENT DOCUMENTS

| | | |
|---|---|---|
| JP | 2011-249786 A | 12/2011 |
| JP | 2016-032057 A | 3/2016 |

*Primary Examiner* — Elmito Breval
(74) *Attorney, Agent, or Firm* — Lee IP Law, P.C.

(57) ABSTRACT

A white LED module includes a circuit board, at least one first LED light source on the circuit board and emitting a first white light having a first color temperature, at least one second LED light source on the circuit board and emitting a second white light having a second color temperature, higher than the first color temperature, a wiring structure in the circuit board to selectively drive the at least one first LED light source and the at least one second LED light source, and a transparent encapsulant on the circuit board, to cover the at least one first LED light source and the at least one second LED light source. The transparent encapsulant includes a transparent resin and a light-scattering powder in the transparent resin.

20 Claims, 10 Drawing Sheets (56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,247,827 B2 | 8/2012 | Helbing | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,643,041 B2 | 2/2014 | Lee | |
| 8,735,931 B2 | 5/2014 | Han et al. | |
| 8,757,826 B2 | 6/2014 | Sakai et al. | |
| 8,766,295 B2 | 7/2014 | Kim | |
| 2012/0097985 A1 | 4/2012 | Liu et al. | |
| 2013/0194795 A1* | 8/2013 | Onaka | F21V 5/04 362/231 |
| 2014/0015428 A1 | 1/2014 | Tao et al. | |
| 2015/0016107 A1 | 1/2015 | Wimmer et al. | |
| 2015/0034980 A1* | 2/2015 | Windisch | H01L 27/15 257/89 |
| 2015/0097496 A1 | 4/2015 | Edwards | |
| 2016/0276549 A1* | 9/2016 | Yamashita | G02B 6/0091 |
| 2017/0048941 A1* | 2/2017 | Kondo | C09K 11/0883 |
| 2017/0238390 A1* | 8/2017 | Yamakawa | F21S 2/00 315/294 |
| 2018/0215308 A1* | 8/2018 | Himeno | H01L 33/00 |
| 2018/0259166 A1* | 9/2018 | Min | F21K 9/00 |
| 2018/0324923 A1* | 11/2018 | Xu | H05B 33/0827 |
| 2018/0351060 A1* | 12/2018 | Kiba | H01L 33/62 |

* cited by examiner

WHITE LIGHT EMITTING DIODE MODULE AND LIGHTING APPARATUS

CROSS-REFERENCE TO RELATED APPLICATION

Korean Patent Application No. 10-2018-0064114 filed on Jun. 4, 2018 in the Korean Intellectual Property Office, and entitled: "White Light Emitting Diode Module and Lighting Apparatus," is incorporated by reference herein in its entirety.

BACKGROUND

1. Field

Embodiments relate to a white light emitting diode (LED) module and a lighting apparatus including the same.

2. Description of the Related Art

In general, light emitting diodes (hereinafter, referred to as 'LED') may be combined with a wavelength conversion material such as a phosphor to be used as white LED light sources.

A white LED light source having two channels with different correlated color temperatures (CCT) is included in one module or one lighting apparatus, and as a current level is adjusted for each channel, white light having various correlated color temperatures may be implemented.

SUMMARY

According to an aspect, a white LED module includes a circuit board, at least one first LED light source on the circuit board and emitting a first white light having a first color temperature, at least one second LED light source on the circuit board and emitting a second white light having a second color temperature, higher than the first color temperature, a wiring structure in the circuit board to selectively drive the at least one first LED light source and the at least one second LED light source, and a transparent encapsulant on the circuit board, to cover the at least one first LED light source and the at least one second LED light source, the transparent encapsulant including a transparent resin and a light-scattering powder in the transparent resin.

According to an aspect, a white LED module includes a circuit board, a plurality of first LED light sources on the circuit board and emitting a first white light having a first color temperature, a plurality of second LED light sources on the circuit board and emitting a second white light having a second color temperature, higher than the first color temperature, a plurality of third LED light sources on the circuit board and emitting a third white light having a third color temperature higher than the first color temperature, a wiring structure in the circuit board to respectively connect the plurality of first LED light sources, the plurality of second LED light sources and the plurality of third LED light sources in series or in series/parallel, and to selectively drive at least one of the plurality of first to third LED light sources, and a transparent encapsulant on the circuit board, to cover the plurality of first to third LED light sources, the transparent encapsulant including a transparent resin and a light-scattering powder in the transparent resin.

According to an aspect, a lighting apparatus includes a lighting housing, a white LED module mounted in the lighting housing, and a driving controller controlling supply of a current to the white LED module. The white LED module includes a first channel on which L number of first LED light sources, emitting a first white light having a first color temperature, are connected, a second channel on which M (L>M) number of second LED light sources, emitting a second white light having a second color temperature, higher than the first color temperature, are connected, a third channel on which N (M>N) number of third LED light sources, emitting the second white light having the second color temperature, are connected, and a transparent encapsulant including a transparent resin and a light-scattering powder in the transparent resin, the transparent encapsulant covering the first to third LED light sources. The driving controller is to selectively drive one of the first channel and the second channel or a combination of the first and third channels.

BRIEF DESCRIPTION OF THE DRAWINGS

Features will become apparent to those of skill in the art by describing in detail exemplary embodiments with reference to the attached drawings in which.

DETAILED DESCRIPTION

Hereinafter, various example embodiments will be described in detail with reference to the accompanying drawings.

Figure 1:
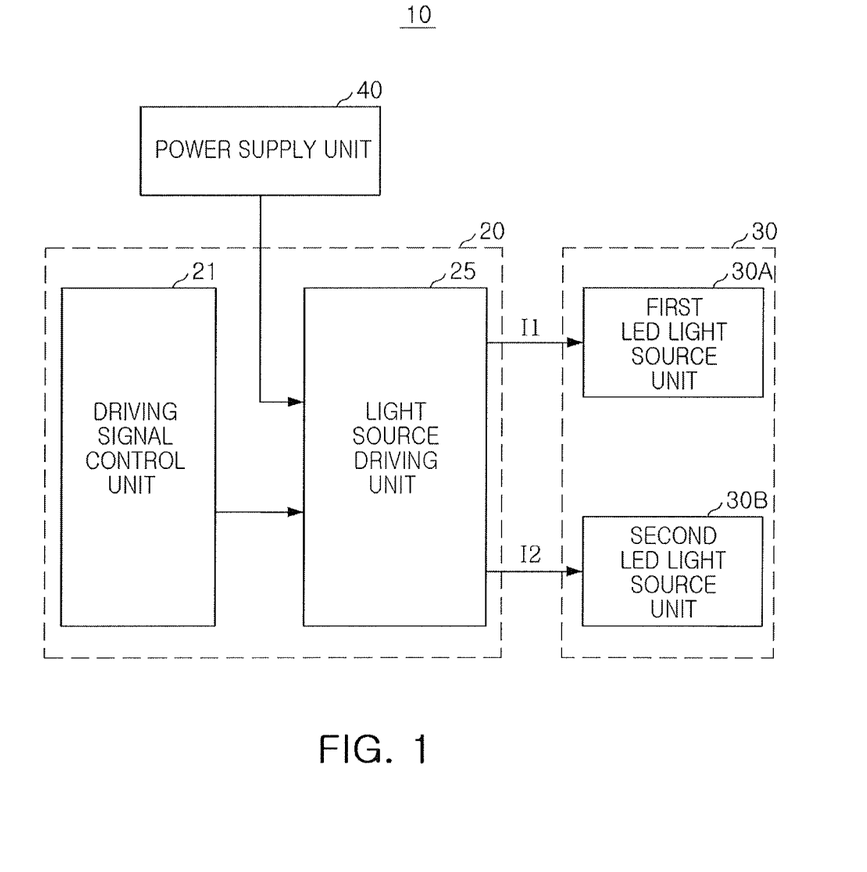
FIG. 1 illustrates a block diagram of a main configuration of a lighting apparatus according to an example embodiment.

FIG. 1 is a block diagram illustrating a configuration of a lighting apparatus 10 according to an example embodiment. Referring to FIG. 1, the lighting apparatus 10 according to the example embodiment may include a driving controlling unit 20, a light source unit 30, and a power supply unit 40. The light source unit 30, the driving controlling unit 20, and/or the light source unit 30 may be constituted as a single LED module.

The driving controlling unit 20 may include the light source driving unit 25 and a driving signal control unit 21. The power supply unit 40 may supply alternating current (AC) or direct current (DC) power to the light source driving unit 25 of the driving controlling unit 20. The light source driving unit 25 may be supply currents I1 and I2, controlled by a driving signal output from the driving signal control unit 21, to first and second LED light source units 30A and 30B. In the example embodiment, the light source driving unit 25 may be controlled to apply the same level of currents I1 and I2 to the first and second LED light source units 30A and 30B.

In example embodiments, the driving controlling unit 20 may further include a communications module, transmitting and receiving data regarding color characteristics, e.g., a measured color temperature, to the interior or from the exterior of the lighting apparatus 10. The driving controlling unit 20 may further include a signal processing unit, processing data of at least one of an illuminance sensor, a motion sensor, and an image sensor to transmit and receive the data to the interior or from the exterior of the lighting apparatus 10.

The light source unit 30 employed in the example embodiment may include the first LED light source unit 30A and the second LED light source unit 30B, emitting white light of different correlated color temperatures (CCT). In detail, the first LED light source unit 30A may include at least one white LED light source to emit a first white light, e.g., warm white light, having a first color temperature. The second LED light source unit 30B may include at least one white LED light source to emit a first white light, e.g., cool white light, having a second color temperature, higher than the first color temperature. The first and second LED light source units 30A and 30B may be provided in different numbers in consideration of luminous flux, based on a color temperature.

Since white light having a high color temperature has a relatively high luminous flux, the number of the first LED light source units 30A may be greater than the number of the second LED light source units 30B, such that the luminous flux may be maintained at the same or a similar level depending on a selected color temperature. Thus, even when in the case in which the first and second LED light source units 30A and 30B are configured to be provided in different numbers, the first and second light source units 30A and 30B may be connected in series or in series/parallel to have the same level of driving voltage (see FIG. 4).

The light source unit 30 may emit white light having a color temperature in an intermediate range by mixing light generated by the first and second LED light source units 30A and 30B. In this case, the light source driving unit 25 may individually control currents supplied to the first and second LED light source units 30A and 30B by the driving signal of the driving signal control unit 21, such that luminous flux of the mixed white light may be maintained.

Figure 2:
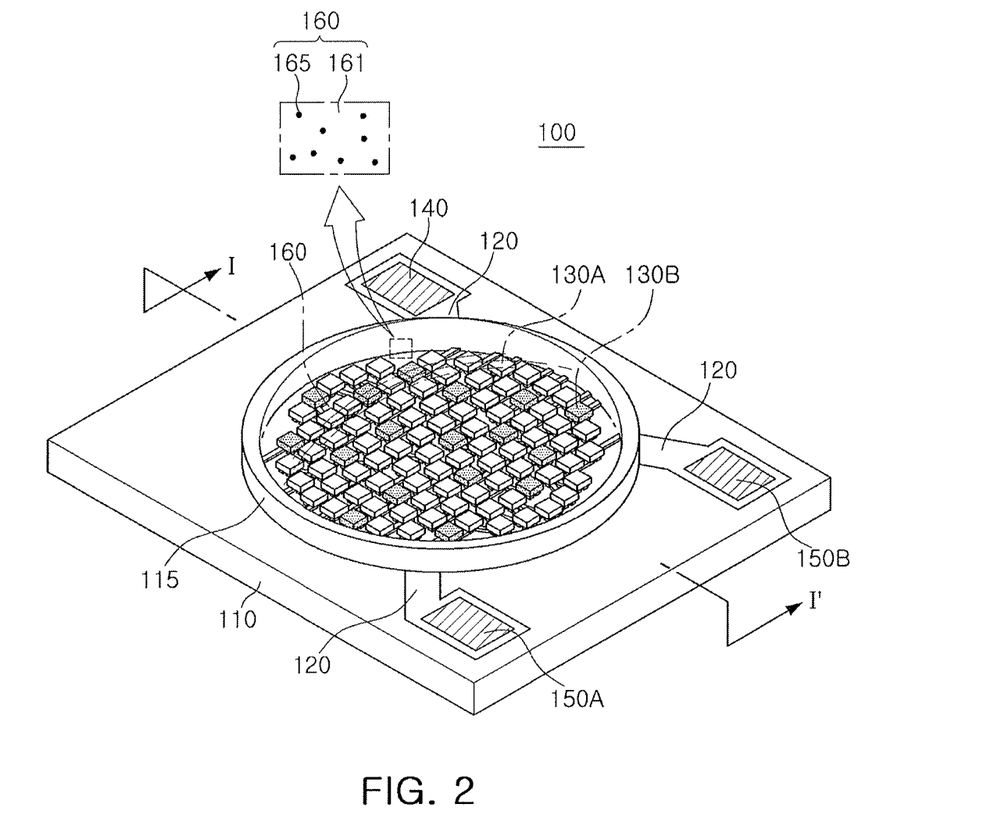
FIGS. 2 and 3 illustrate a perspective view and a cross-sectional view schematically illustrating a white LED module according to an example embodiment.
Figure 3:
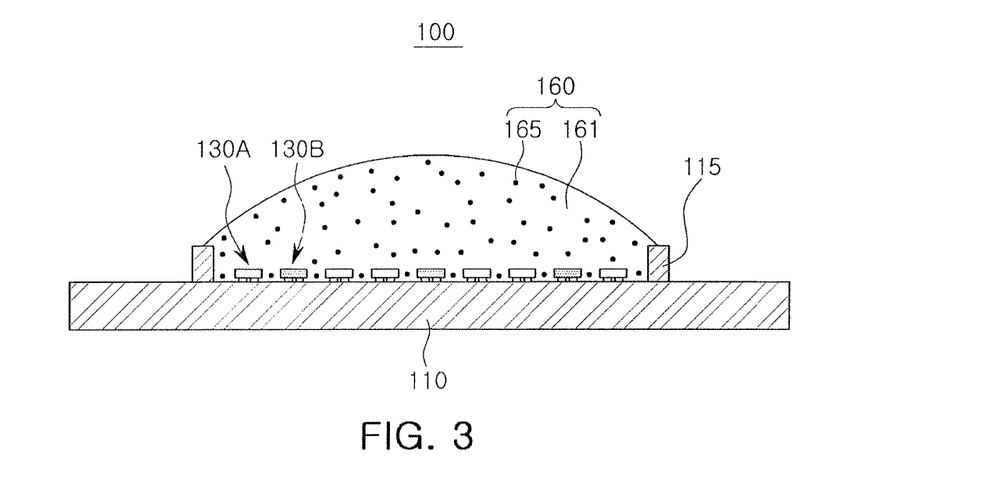

FIG. 2 is a schematic perspective view of an LED module according to an example embodiment. FIG. 3 is a cross-sectional view of the LED module, taken along line I-I' of FIG. 2.

Referring to FIGS. 2 and 3, an LED module 100 according to an example embodiment may include a circuit board 110, a plurality of first and second LED light sources 130A and 130B mounted on the circuit board 100, and a transparent encapsulant 160 covering the plurality of first and second LED light sources 130A and 130B.

The circuit board 110 may include a wiring structure, e.g., a metal pattern, connecting the plurality of first and second LED light sources 130A and 130B to each other. The wiring structure may include a connection wiring 120 connecting the plurality of first and second LED light sources 130A and 130B in series or in series/parallel, a common terminal 140 commonly connected to one end of the connection wiring 120 related to the plurality of first and second LED light sources 130A and 130B, and first and second terminals 150A and 150B connected to other ends of the connection wiring 120, respectively, related to the connected first and second LED light sources 130A and 130B. The plurality of first and second LED light sources 130A and 130B, together with the wiring structure, may serve as the first and second LED light source units 30A and 30B described above with reference to FIG. 1.

For example, the circuit board 110 may include a conductive and insulating material, and may include a resin body, e.g., epoxy, triazine, silicone, polyimide, or the like, a ceramic body, e.g., AlN or $Al_2O_3$, or a metal body. In a specific example, the circuit board 110 may be an FR4-type printed circuit board (PCB) or a metal PCB (MPCB).

The plurality of first and second LED light sources 130A and 130B may be an LED chip or a chip scale package (CSP) having a wavelength converter to emit white light. Various examples of chip scale packages that may be employed in the example embodiment will be described later with reference to FIGS. 8 and 9.

The plurality of first LED light sources 130A may be emit first white light having a first color temperature. The plurality of second LED light sources 130B may be configured to emit second white light having a second color temperature, higher than the first color temperature. For example, the first color temperature may range from 2700 K to 3200 K and the second color temperature may range from 4500 K to 5500 K.

In the example embodiment, the transparent encapsulant 160 may be on the circuit board 110 to cover the plurality of first and second LED light sources 130A and 130B. The transparent encapsulant 160 may include a transparent resin 161 containing a light-scattering powder 165. For example, the transparent resin 161 may be formed by of a resin, e.g., silicone, epoxy, combinations thereof, or the like. The light-scattering powder 165 may be $SiO_2$, $Al_2O_3$, $TiO_2$, silicon particles, a combination thereof, or the like. The average particle size of the light-scattering powder 165 may range from about 1 μm to about 20 μm.

The light-scattering powder 165 employed in the example embodiment may be included in an amount of 100% or more with respect to the weight of the transparent resin 161. As the content of the light-scattering powder 165 is increased, the viscosity of the resin may be increased, and thus, workability may be reduced. In the transparent encapsulant 160, the weight ratio of the light-scattering powder 165 to the transparent resin 161 may be in the range of 1:1 to 3:1, e.g., 2.2:1 to 2.6:1.

In another example embodiment, the average particle size of the light-scattering powder 165 may be nanosized, e.g., in a range of 10 nm to 100 nm. When nanosized, the light-scattering powder 165 may be included in the range of 0.05 to 0.1, as compared to the weight of the transparent resin.

In the example embodiment, the light-scattering powder 165 may be employed to prevent color unevenness from being caused due to an inactivated LED light source. Thus, the light-scattering powder 165 may be employed in a considerably larger amount than typical. As such, the transparent encapsulant 160 employed in the example embodiment may prevent color unevenness caused by the LED light source that is not driven, thereby providing white light having excellent quality.

In addition, the transparent encapsulant 160 may be provided in a dome shape to obtain a sufficient effect, e.g., to insure all light emitted passes through the transparent encapsulant 160. For example, a height of the dome may be designed to be relatively high, e.g., to be within a range of 800 to 1000 μm. A formation region of the transparent encapsulant 160 may be defined by a dam structure 115 on and extending upwards from the circuit board 110, to secure the dome structure. In other words, the dam structure 115 may define the extent of the transparent encapsulant 160 on the circuit board 110.

As illustrated in FIG. 3, the dam structure 115 may be protrude upward from an upper surface of the circuit board 110 and may have a ring shape. The arrangement of the first and second LED light sources 130A and 130B may be variously changed. Thus, shapes of the circuit board 110 and the dam structure 115 employed in the example embodiment may include quadrangular shapes, circular shapes, meandering shapes, or the like, and a shape of the dam structure 115 may be determined by a layout of the circuit board 110. The dam structure 115 may form a closed shape or may have some break therein, as long as sufficient restraint is provided for the transparent encapsulant 160.

The first LED light sources 130A and the second LED light sources 130B may be selectively driven, e.g., switched, to generate the first white light having the first color temperature, the second white light having the second color temperature, or a third white light having an intermediate color temperature therebetween. However, the color temperature of ultimately-emitted light passing through the transparent encapsulant 160 may be lowered by the light-scattering powder 165 of a relatively high proportion employed in the example embodiment. Thus, the color temperature of the ultimately emitted light may be designed in consideration of such a color temperature lowering phenomenon.

Figure 4:
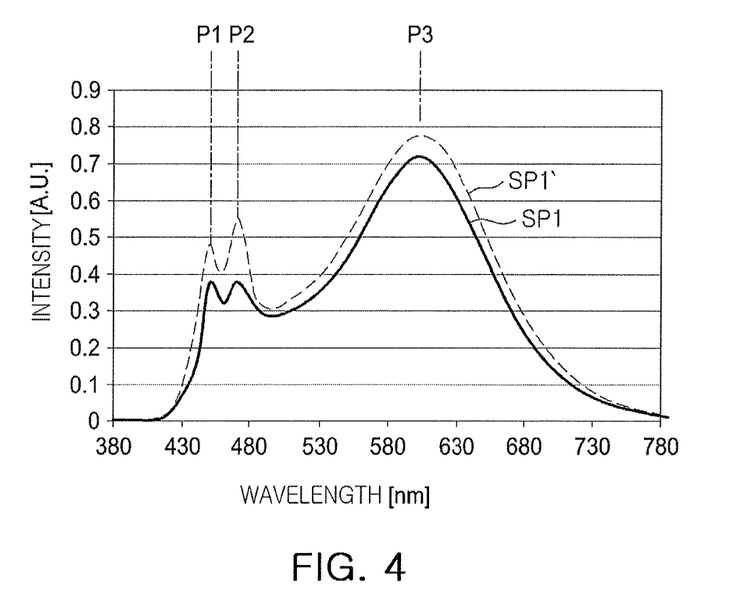
FIGS. 4 to 6 illustrate emission light spectra of a white LED module according to an example embodiment.
Figure 5:
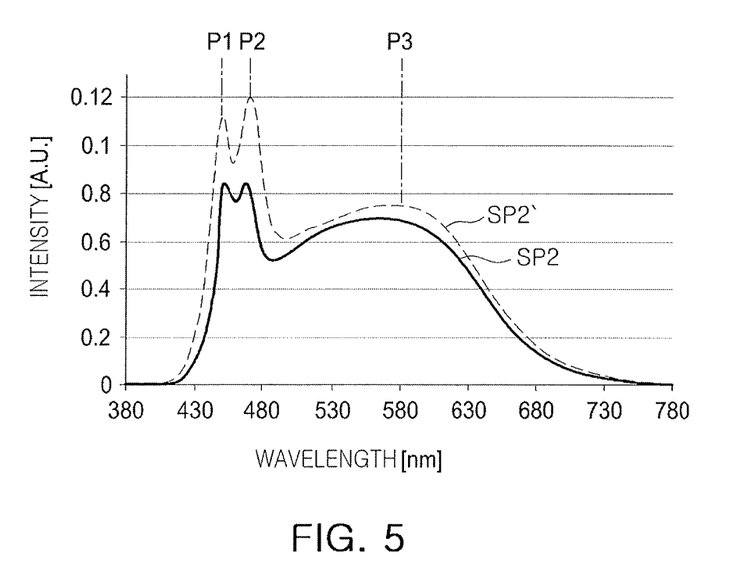
Figure 6:
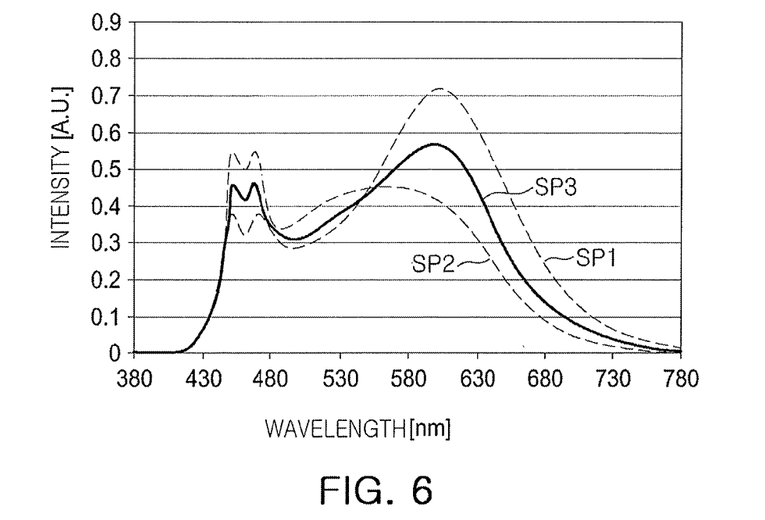

Hereinafter, the color temperature of emitted light will be described with reference to FIGS. 4 to 6. FIGS. 4 to 6 illustrate emitted-light spectra of a white LED module according to an example embodiment.

In general, the first and second color temperatures may be determined by emission spectra SP1' and SP2' of the first and second white light. The emitted light spectra SP1' and SP2' of the first and second LED light sources 130A and 130B are illustrated in FIGS. 4 and 5, respectively. The emission spectra SP1' and SP2' may be selected depending on emission light conditions of an LED chip and the type and mixing ratio of a wavelength conversion material.

For example, the first and second LED light sources 130A and 130B may each include an LED chip emitting light having a peak wavelength P1 in the same first peak wavelength in the indigo or blue region, e.g., about 440 nm to about 460 nm. In addition, the first and second LED light sources 130A and 130B may include wavelength conversion materials, e.g., a green phosphor for conversion into light having a second peak wavelength P2 and a red phosphor for conversion into light having a third peak wavelength P3.

The mixing ratios of the wavelength conversion materials employed in the first and second LED light sources 130A and 130B may be different from each other. For example, the first LED light source 130A may include a relatively large amount of red phosphor, to have the emission spectrum SP1' having a higher intensity in a long wavelength region than a short wavelength region, as illustrated in FIG. 4. As a result, the first LED light source 130A may provide warm white light of, e.g., 3000 K. The second LED light source 130B may include a relatively large amount of green phosphors to have the emission spectrum SP2' having a higher intensity in a short wavelength region than a long wavelength region, as illustrated in FIG. 5. As a result, the second LED light source 130B may provide cool white light of, for example, 5000 K.

As described above, the first and second white light emitted from the first and second LED light sources 130A and 130B, respectively, may have color temperatures lowered when being transmitted through the transparent encapsulant 160 including the light-scattering powder 165 in a relatively large amount. In detail, referring to FIGS. 4 and 5, the emission spectra SP1' and SP2' of the first and second white light are overall reduced in intensity during a light scattering process, and the degrees of decrease thereof may be different for respective wavelength bands. Thus, color temperatures may be changed thereby. Since a reduction in the intensity of light may relatively increase in the short wavelength region, the white light having been transmitted through the transparent encapsulant 160 may have a tendency to have a lowered color temperature, e.g., be warmer than actually output by the first and second white light emitted from the first and second LED light sources 130A and 130B.

In the example embodiment, color temperatures of the first and second white light after passing through the transparent encapsulant 160 may be at least 100 K lower than the first and second color temperatures, respectively, and the color temperature of the second white light having a relatively high color temperature may be more affected. For example, as illustrated in FIG. 4, the emission spectrum SP1' of 3000 K white light may be changed to an emission spectrum SP1 of 2700 K white light after passing through the transparent encapsulant 160. As illustrated in FIG. 5, the emission spectrum SP2' of 5000 K white light may be changed to an emission spectrum SP2 of 4000 K white light after passing through the transparent encapsulant 160. Thus, the ultimately emitted light may be selectively provided as white light of 2700 K or 4000 K, respectively.

The lowering of the color temperature by the light-scattering powder 165 may be different depending on conditions such as the content of light-scattering powder, emission spectrum, or the like. For example, when the first color temperature ranges 2700 to 3200 K and the second color temperature ranges from 4500 to 5500 K, the color temperature of the first white light may be lowered further than the first color temperature by 100 K or more after passing through the transparent encapsulant 160, and the color temperature of the second white light may be lowered further than the second color temperature by 500 K or more after passing through the transparent encapsulant 160.

When the first and second LED light sources 130A and 130B are driven at a constant rate, mixed-white light in an intermediate color temperature range may be provided. As illustrated in FIG. 6, the mixed white light may have a mixed emission spectrum SP3 corresponding to approximately an average of the ultimate emission spectrum SP1 of the first LED light source and the ultimate emission spectrum SP2 of the second LED light source. For example, the mixed white light may constitute a mixing ratio of two light sources to provide 3000 K of white light.

The second LED light sources 130B may be distributed between the first light sources 130A at a predetermined period. The first and second LED light sources 130A and 130B may have various symmetrical arrangements such as left-right symmetry or rotational symmetry, to have uniform light distribution. With the symmetrical arrangement, required white light may be provided through uniform color mixing, even in a case in which luminous flux ratios of the first and second LED light sources 130A and 130B are changed.

The first and second LED light sources 130A and 130B may have the same size, and the number of the first LED light sources 130A may be greater than the number of the second LED light sources 130B. In general, white light having a relatively high color temperature tends to have relatively high luminous flux. Thus, for example, in the case in which only one of the first and second LED light sources 130A and 130B of, e.g., 2700 K or 4000 K, is selected, the number of the first LED light sources 130A may be greater than the number of the second LED light sources 130B, to maintain a uniform luminous flux.

As the numbers of the first and second LED light sources 130A and 130B are different, the luminous fluxes respectively emitted from the first and second LED light sources 130A and 130B may be different at the same level of applied current, while may be configured to be connected in series or in series/parallel to be driven at the same level of current.

Figure 7:
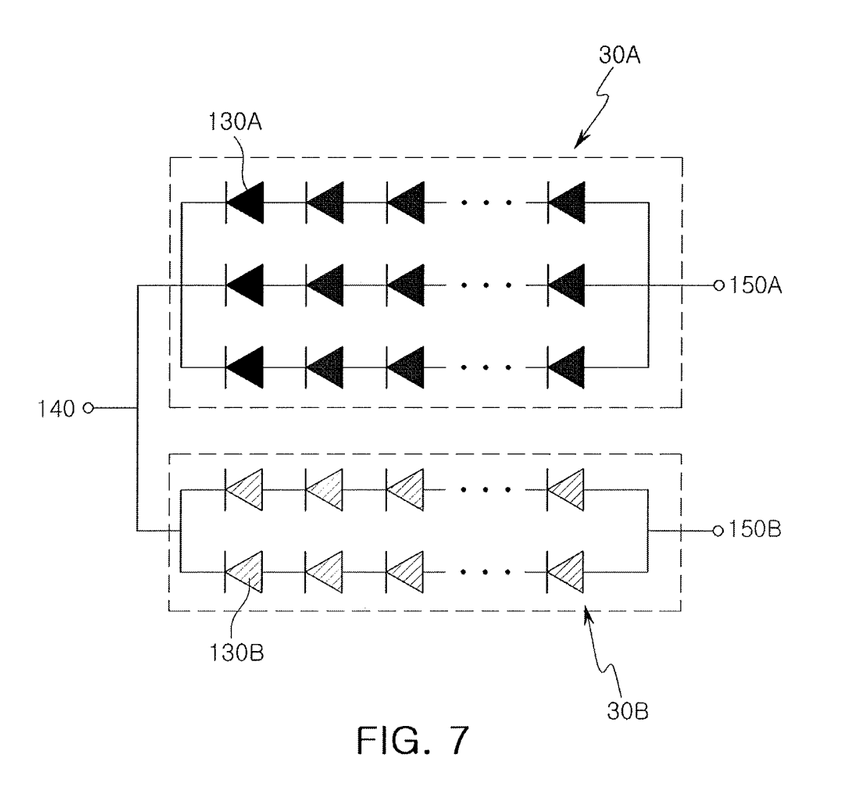
FIG. 7 illustrates a schematic view of a circuit of a light source unit employed in a white LED module according to an example embodiment.

FIG. 7 is a schematic diagram illustrating a circuit of light sources employed in an LED module according to an example embodiment. Referring to FIG. 7, first and second LED light source units 30A and 30B may include different numbers of first and second LED light sources 130A and 130B, respectively. The first and second LED light sources 130A and 130B and 130B may be connected in series or in parallel in different manners.

As described above, the number of the first LED light sources 130A may be greater than the number of the second LED light sources 130B to maintain uniform luminous flux. The first LED light sources 130A may include three strings in which light sources are connected in series, and the three strings may be connected to each other in parallel. The second LED light sources 130B may include two strings in which light sources are connected in series, and the two strings may be connected to each other in parallel.

Each string of the first and second LED light sources 130A and 130B may include the same number of LED light sources connected in series. Thus, when the first and second LED light sources 130A and 130B have the same level of driving voltage, the first and second LED light source units 30A and 30B may be driven by the same level of applied current.

In addition, the first and second LED light sources 130A and 130B connected in series may be individually driven by currents $I_1$ and $I_2$ respectively provided by a driving controlling unit, and may control luminous flux ratios of the first and second LED light sources 130A and 130B to emit white light having required intermediate color temperature.

The first and second LED light sources 130A and 130B employed in the example embodiment may be provided as an LED chip or a chip scale package (CSP) having a wavelength converter to emit white light. Various examples of chip scale packages that may be employed in the example embodiment will be described with reference to FIGS. 8 and 9.

Figure 8:
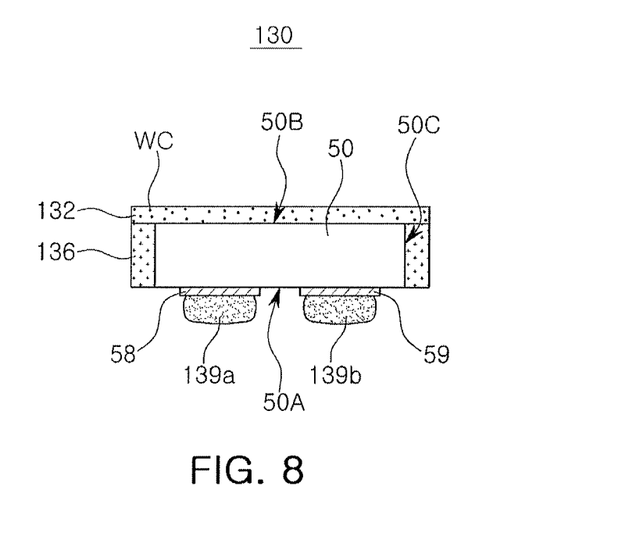
FIGS. 8 and 9 illustrate cross-sectional views of various examples of LED light sources according to example embodiments.

Referring to FIG. 8, an LED light source 130 employable in the example embodiment may include an LED chip 50, first and second electrodes 58 and 59 on a first surface 50A of the LED chip 50, a reflective layer 136 surrounding a side surface 50C of the LED chip 50, and a wavelength conversion layer 132 on a second surface 50B, opposite the first surface 50A, of the LED chip 50.

The first and second electrodes 58 and 59 may be formed of a conductive material. First and second bumps 139a and 139b may be additionally formed on the first and second electrodes 58 and 59.

The reflective layer 136 may reflect light emitted to the side surface 50C of the LED chip 50 to enable the light to be directed to an upper part thereof, e.g., out through the second surface 50B. The reflective layer 136 may include a light reflective material, e.g., $SiO_2$, $TiO_2$, $Al_2O_3$, or the like. In another example embodiment, the wavelength conversion layer 132 may extend upwards and/or outwards and/or may be on the side surface 50C of the LED chip 50 in place of the reflective layer 136.

The wavelength conversion layer 132 may include a wavelength conversion material WC converting a portion of blue light emitted by the LED chip 50 into a different wavelengths such that the LED light source 130 emits white light. The wavelength conversion material WC may include a phosphor or a quantum dot, converting a portion of the blue light into yellow and/or green and red light.

For example, the LED chip 50 may emit blue light, e.g., a dominant wavelength in the range of 440 nm to 460 nm. The wavelength conversion material WC may include a phosphor or a quantum dot that converts a portion of the blue light into yellow and/or green light, and a phosphor or a quantum dot that converts a portion of the blue light into red light. The wavelength conversion layer 132 may be a resin layer in which a phosphor and a quantum dot are dispersed, or a ceramic film formed of a sintered body of a ceramic phosphor.

Figure 9:
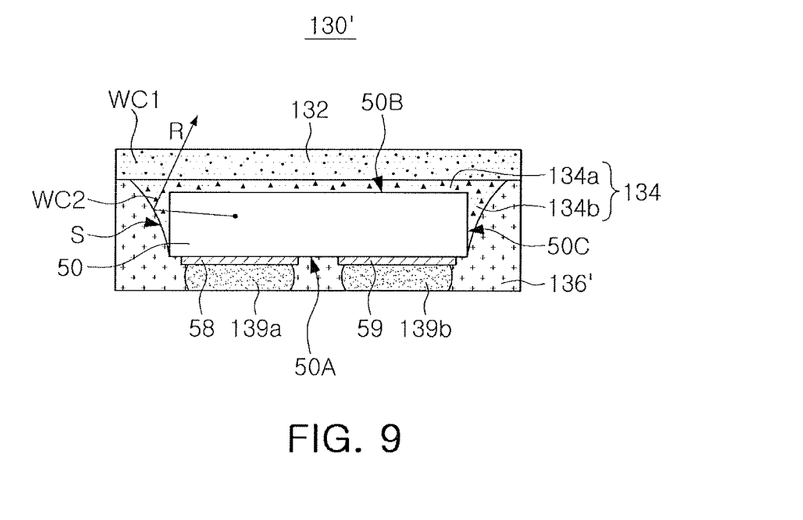

Referring to FIG. 9, an LED light source 130' according to an example embodiment may include the LED chip 50, first and second electrodes 58 and 59 on the first surface 50A of the LED chip 50, a reflective layer 136' surrounding the side surface 50C of the LED chip 50, and the wavelength conversion layer 132 on a second surface 50B of the LED chip 50, in a manner similar to the LED light source 130 according to the foregoing example embodiment.

The LED light source 130' may further include a light transmitting bonding layer 134 to bond the LED chip 50 and the wavelength conversion layer 132 to each other. A resin constituting the light transmitting bonding layer 134 may include at least one bonding material of, e.g., silicone, epoxy, polyacrylate, polyimide, polyamide, benzocyclobutene, or the like.

The wavelength conversion layer 132 may have an area larger than that of the LED chip 50, e.g., may extend along a direction orthogonal to the second surface 50B further than the LED chip 50. The light transmitting bonding layer 134 may include an adhesive region 134a between the wavelength conversion layer 132 and the LED chip 50, and an extension region 134b located along the side surface 50C of the LED chip 50. The adhesive region 134a may be completely between the wavelength conversion layer 132 and the LED chip 50 such that the wavelength conversion layer 132 is not in direct contact with the LED chip 50. The extension region 134b may be completely between the side surface 50C and the reflective layer 136' such that the reflective layer 136' is not in direct contact the side surface 50C.

In the example embodiment, a first wavelength conversion material WC1 may be in the wavelength conversion layer 132 and a second wavelength conversion material WC2 may be in the light transmitting bonding layer 134. The first and second wavelength conversion materials WC1 and WC2 may be provided in the wavelength conversion layer 132 and in the light transmitting bonding layer 134, respectively, according to conversion wavelength. The second wavelength conversion material WC2 in the light transmitting bonding layer 134 adjacent to the LED chip 50 may to provide a relatively long wavelength light. The first wavelength conversion material WC1 in the wavelength conversion layer 132 may provide relatively short wavelength light. For example, the first wavelength conversion material WC1 may be a phosphor or a quantum dot, converting a portion of blue light into yellow and/or green light. The second wavelength conversion material WC2 may be a phosphor or a quantum dot, converting a portion of blue light into red light.

As described above, the light transmitting bonding layer 134 may have an extension region 134b on the side surface 50C of the LED chip 50. The extension region 134b may provide an inclined surface S used for light extraction, thereby reducing total internal reflection on the side surface 50C of the LED chip 50. In addition, the inclined surface S may be combined with the reflective layer 136' to provide a reflective surface, thereby improving light extraction efficiency.

The extension region 134b having an inclined surface may have an increased width toward the wavelength conversion layer 132. A surface shape of the extension region 134b may be changed, depending on the viscosity and/or the amount of an uncured resin for the light-transmitting bonding layer 134. Light may be effectively guided to the wavelength conversion layer 132 by the inclined surface S between the light transmitting bonding layer 134 and a reflective layer 136' (indicated by R).

In the example, the reflective layer 136' may cover a first surface 50A of the LED chip 50 while surrounding the light transmitting bonding layer 134. Conductive bumps 139a and 139b on the first and second electrodes 58 and 59 may have a substantially planar surface with a lower surface of the reflective layer 136. A side surface of the reflective layer 136' may have a substantially flat surface coplanar with the side surface of the wavelength conversion layer 132.

Figure 10:
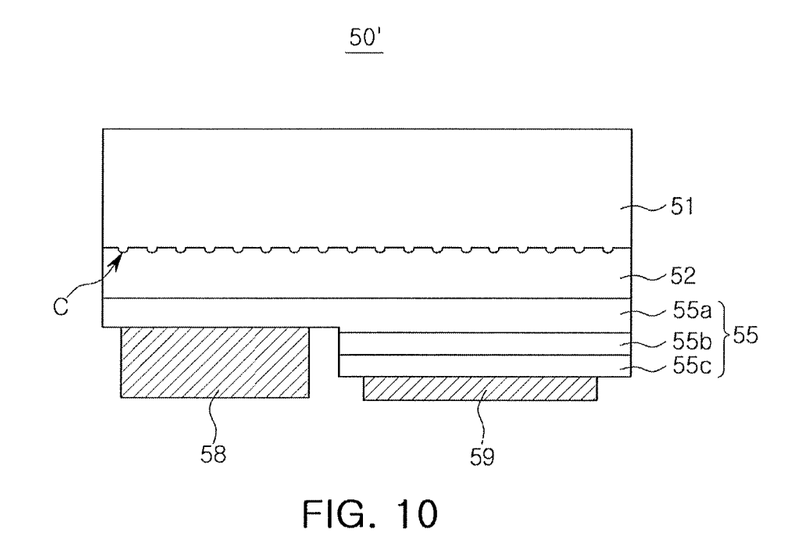
FIGS. 10 and 11 illustrate cross-sectional views of various examples of LED chips that may be employed in an LED light source according to example embodiments.
Figure 11:
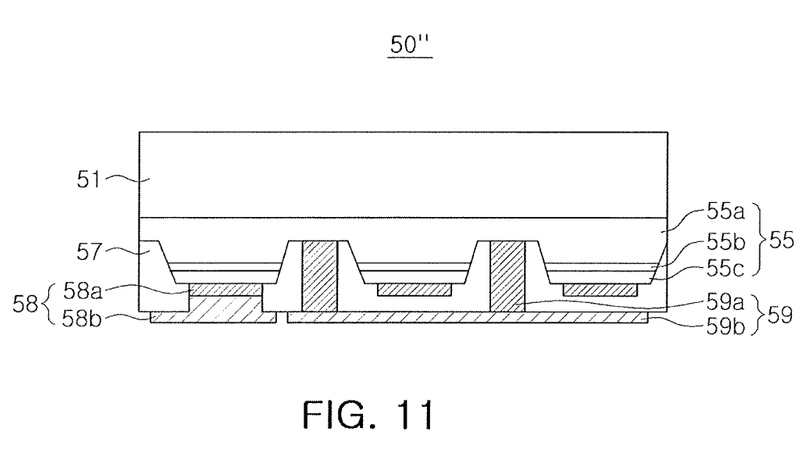

FIGS. 10 and 11 are cross-sectional views illustrating various examples of LED chips that may be employed in an LED light source according to an example embodiment.

Referring to FIG. 10, an LED chip 50' may include a substrate 51, a buffer layer 52, a light emitting stack 55, and first and second electrodes 58 and 59. The light emitting stack 55 may include a first conductivity-type semiconductor layer 55a, an active layer 55b, and a second conductivity-type semiconductor layer 55c.

The substrate 51 may be an insulating substrate, e.g., a sapphire substrate or the like, or may be a conductive or semiconductor substrate, e.g., SiC, Si, $MgAl_2O_4$, MgO, $LiAlO_2$, $LiGaO_2$, GaN substrate, or the like. An uneven portion C may be formed on an upper surface of the substrate 51.

The buffer layer 52 may be a layer of $In_xAl_yGa_{1-x-y}N$ ($0 \leq x \leq 1$, $0 \leq y \leq 1$) or the like. For example, the buffer layer 52 may be a GaN, AlN, AlGaN, or InGaN layer, and may include a plurality of layers or may have a gradually changing composition.

The first and second conductivity-type semiconductor layers 55a and 55c may be formed of a semiconductor doped with an n-type impurity and a semiconductor doped with a p-type impurity, respectively. Inversely, the first and second conductivity-type semiconductor layers 55a and 55c may also be formed of p-type and n-type semiconductors, respectively. The first and second conductivity-type semiconductor layers 55a and 55c may be formed of a nitride semiconductor, for example, a material having a composition of $Al_x$-$In_yGa_{1-x-y}N$ ($0 \leq x \leq 1$, $0 \leq y \leq 1$, $0 \leq x+y \leq 1$), and each layer thereof may be a single layer, but may also include a plurality of layers having different characteristics, e.g., in characteristics of a doping concentration, a composition, or the like. In addition, the first and second conductivity-type semiconductor layers 55a and 55c may also be formed using AlInGaP or AlInGaAs-series semiconductors, as well as the nitride semiconductor.

In the example embodiment, the first conductivity-type semiconductor layer 55a may be, e.g., an n-type gallium nitride (n-GaN) semiconductor doped with silicon (Si) or carbon (C), and the second conductivity-type semiconductor layer 55c may be, e.g., a p-type gallium nitride (p-GaN) semiconductor doped with magnesium (Mg) or zinc (Zn). The active layer 55b may be between the first and second conductivity-type semiconductor layers 55a and 55c, to emit light having a predetermined energy by the recombination of electrons and holes. The active layer 55b may be a layer formed of a single material such as indium gallium nitride (InGaN) or the like, but may have a GaN/InGaN structure in a single quantum well (SQW) structure or a multiple quantum well (MQW) structure in which a quantum barrier layer and a quantum well layer are alternately arranged, e.g., in the case of a nitride semiconductor. In this case, depending on the content of indium (In) in the active layer 55b, a light emission wavelength may be adjusted.

The first and second electrodes 58 and 59 may be electrically connected to the first and second conductivity-type semiconductor layers 55a and 55c, respectively. The first and second electrodes 58 and 59 may be formed to have a single layer structure or a multilayer structure formed of a conductive material. For example, the first and second electrodes 58 and 59 may include one or more of gold (Au), silver (Ag), copper (Cu), zinc (Zn), aluminum (Al), indium (In), titanium (Ti), silicon (Si), germanium (Ge), tin (Sn), magnesium (Mg), tantalum (Ta), chromium (Cr), tungsten (W), ruthenium (Ru), rhodium (Rh), iridium (Ir), nickel (Ni), palladium (Pd), platinum (Pt), or the like, or alloys thereof.

Referring to FIG. 11, an LED chip 50" may include the light emitting stack 55 on the substrate 51. The light emitting stack 55 may include a first conductivity-type semiconductor layer 55a, an active layer 55b and a second conductivity-type semiconductor layer 55c.

The LED chip may include first and second electrodes 58 and 59 connected to the first and second conductivity-type semiconductor layers 55a and 55c, respectively. The first electrode 58 may include a connection electrode 58a, such as a conductive via penetrating through the second conductivity-type semiconductor layer 55c and the active layer 55b to be connected to the first conductivity-type semiconductor layer 55a, and a first electrode pad 58b connected to the connection electrode 58a. The connection electrode 58a may be surrounded by an insulating portion 57 to be electrically isolated from the active layer 55b and the second conductivity-type semiconductor layer 55c. The connection electrode 58a may be in a region from which the light emitting stack 55 has been etched.

The number, shape, and pitch of the connection electrode 58a, a contact area thereof with the first conductivity-type semiconductor layer 55a, and the like may be appropriately designed, such that contact resistance of the connection electrode 58a may be lowered. In addition, in the case of the connection electrode 58a, a plurality of connection electrodes may be arranged in rows and columns on the light emitting stack 55, to improve a current flow. The second electrode 59 may include an ohmic contact layer 59a and a second electrode pad 59*b* disposed sequentially on the second conductivity-type semiconductor layer 55*c*.

Each of the connection electrode 58*a* and the ohmic contact layer 59*a* may have a structure in which a conductive material having ohmic characteristics with the first and second conductivity-type semiconductor layers 55*a* and 55*c* is formed in a single layer or a multiple layer. For example, the connection electrode 58*a* and the ohmic contact layer 59*a* may be formed by a process of depositing, sputtering or the like, one or more of materials, such as Ag, Al, Ni, Cr, transparent conductive oxide (TCO), or the like.

The first and second electrode pads 58*b* and 59*b* may be connected to the connection electrode 58*a* and the ohmic contact layer 59*a*, respectively, and may be provided as external terminals of the LED chip 50". For example, the first and second electrode pads 58*b* and 59*b* may be formed of Au, Ag, Al, Ti, W, Cu, Sn, Ni, Pt, Cr, NiSn, TiW, AuSn, or eutectic metals thereof, or the like.

Figure 12:
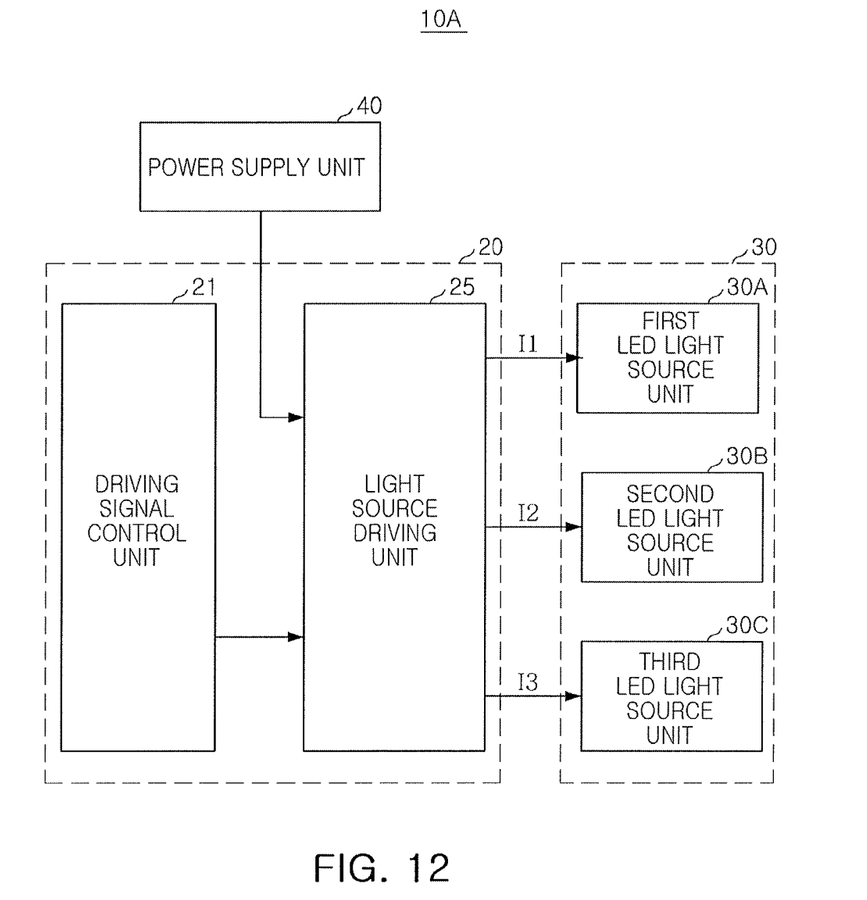
FIG. 12 illustrates a block diagram of a main configuration of a lighting apparatus according to an example embodiment.

FIG. 12 is a block diagram illustrating a configuration of a lighting apparatus according to an example embodiment. Referring to FIG. 12, a lighting apparatus 10A according to the example embodiment may be understood as being similar to the lighting apparatus 10 illustrated in FIG. 1, except that a third LED light source unit 30C is further included. The components of the example embodiment with reference to FIG. 12 may be understood with reference to the description of the same or similar components of the lighting apparatus 10 illustrated in FIG. 1, unless otherwise specified.

The lighting apparatus 10A according to the example embodiment may include three channels that may be independently driven. Each of the three channels may be configured to each include the first LED light source unit 30A, the second LED light source unit 30B, and the third LED light source unit 30C. The first LED light source unit 30A and the second LED light source unit 30B may emit first and second white light having first and second color temperatures, respectively, and the third LED light source unit 30C may emit a third white light having a third color temperature.

In an example embodiment, the third color temperature may be substantially the same as the second color temperature. LED light sources constituting the third LED light source unit 30C may be the same chip scale package as LED light sources constituting the second light source unit 30B.

The driving controlling unit 20 may provide three different color temperatures, using a switching method. For example, currents I1, I2 and I3 controlled by a driving signal of a driving signal control unit 21 may be supplied to the first to third LED light source units 30A, 30B and 30C. In the example embodiment, the light source driving unit 25 may selectively drive the first and second LED light source units 30A and 30B to provide white light having a first color temperature of, e.g., 2700 K, or a second color temperature of, e.g., 4000 K, or may simultaneously drive the first and third LED light source units 30A and 30C to mix first and third white lights to provide white light having a third color temperature of, e.g., 3000 K.

Figure 13:
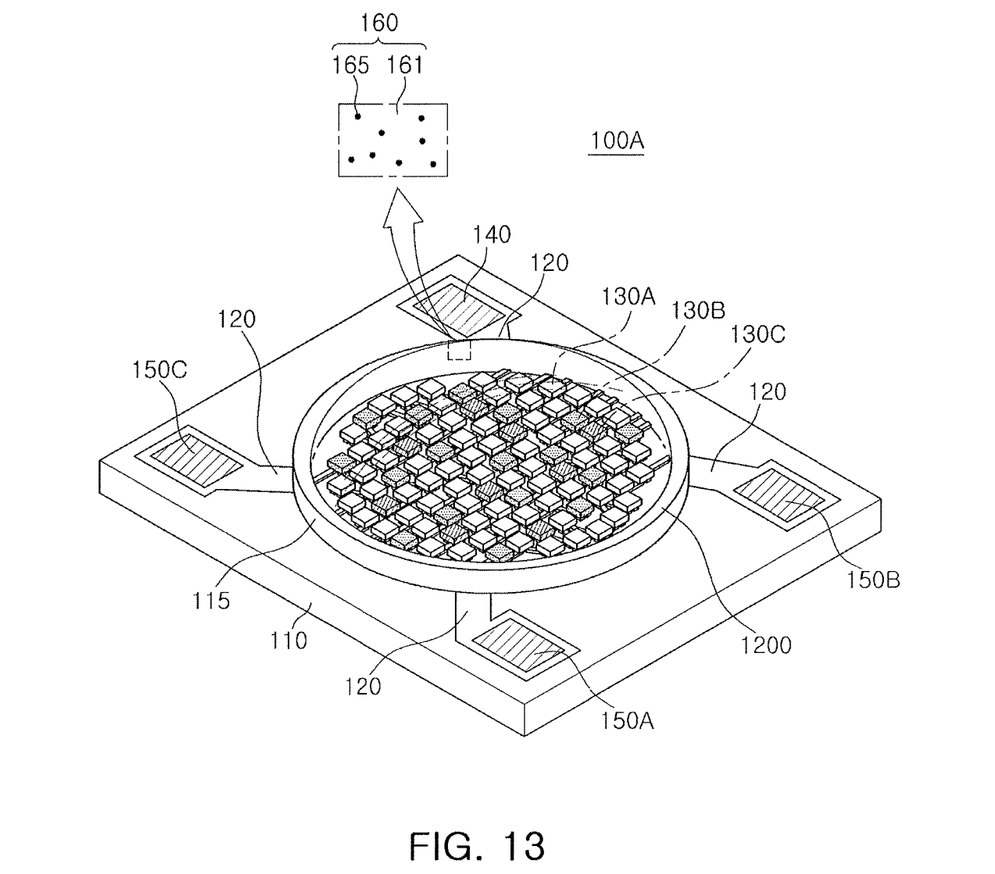
FIG. 13 illustrates a schematic perspective view of a white LED module according to an example embodiment.

FIG. 13 is a schematic perspective view of a white LED module according to an example embodiment. Referring to FIG. 13, an LED module 100A according to an example embodiment may be similar to the LED module 100 illustrated in FIGS. 2 and 3, except that the LED module 100A further includes a plurality of third LED light sources 130C. Components in the example embodiment may be understood with reference to the description of the same or similar components of the LED module 100 illustrated in FIGS. 2 and 3, unless specifically described otherwise.

A circuit board 110 may include a wiring structure, e.g., a metal pattern, connecting first to third LED light sources 130A, 130B and 130C. The wiring structure may include the connection wiring 120 respectively connecting the plurality of first to third LED light sources 130A, 130B and 130C in series or in series/parallel, the common terminal 140 commonly connected to one end of the connection wiring 120, related to the plurality of first to third LED light sources 130A, 130B and 130C, and first to third terminals 150A, 150B and 150C connected to other ends of the connection wiring 120, respectively, the connection wiring 120 being related to the plurality of connected first to third LED light sources 130A, 130B and 130C.

The plurality of first LED light sources 130A may be emit first white light having a first color temperature ranging, e.g., from 2700 K to 3200 K. The plurality of second LED light sources 130B may emit second white light having a second color temperature, ranging from 4500 K to 5500 K, higher than the first color temperature. The plurality of third LED light sources 130C may emit third white light having a third color temperature higher than the first color temperature. In a specific example, the plurality of third LED light sources 130C may emit the second white light having the second color temperature ranging, e.g., from 4500 K to 5500 K in the same manner as the plurality of second LED light sources 130B.

In the example embodiment, the transparent encapsulant 160 may be on the circuit board 110 to cover the plurality of first to third LED light sources 130A, 130B and 130C. The transparent encapsulant 160 may include the transparent resin 161 containing a light-scattering powder 165. For example, the transparent resin 161 may be silicone, epoxy, a combination thereof, or the like. The light-scattering powder 165 may be $SiO_2$, $Al_2O_3$, $TiO_2$, silicon particles, combinations thereof, or the like.

An average particle size of the light-scattering powder 165 may range from about 1 µm to about 20 µm, and the light-scattering powder 165 employed in the example embodiment may be contained in an amount of 100% or more, based on the weight of the transparent resin 161. In a specific example, a weight ratio of the light-scattering powder 165 to the transparent resin 161 may be in the range of 1:1 to 3:1, in detail, 2.2:1 to 2.6:1.

As described above, the transparent encapsulant 160 employed in the example embodiment may prevent color unevenness caused due to an LED light source that is not driven, thereby providing white light of excellent quality.

Figure 14:
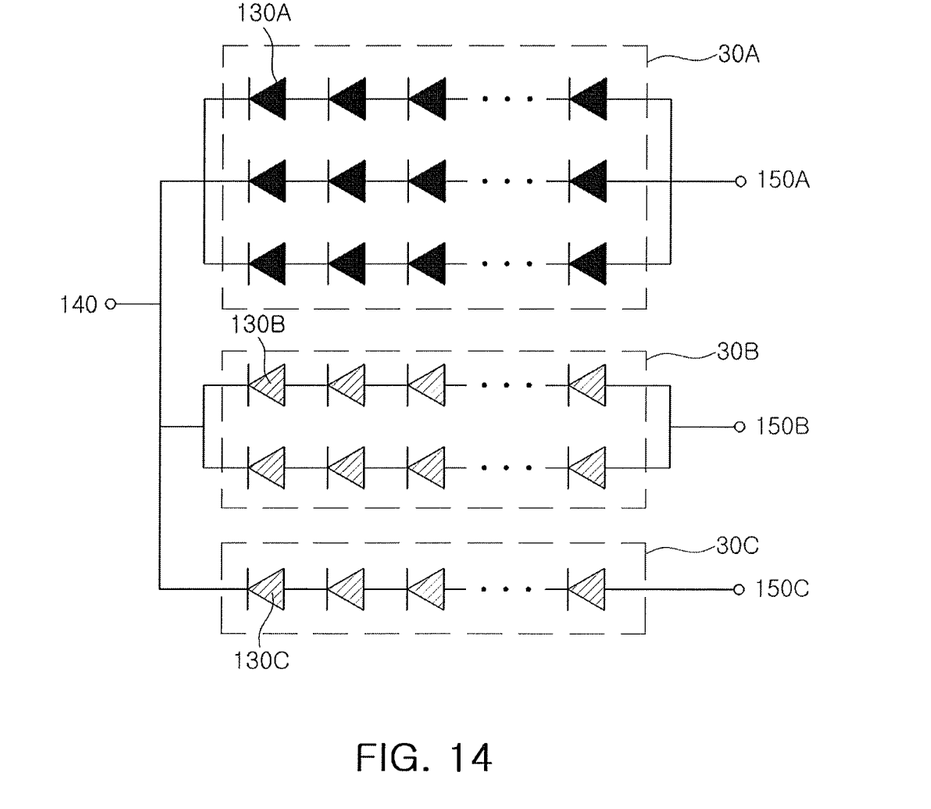
FIG. 14 illustrates a schematic diagram of a circuit of a light source unit employed in a white LED module according to an example embodiment.

FIG. 14 is a schematic diagram illustrating a circuit of a light source unit employed in a white LED module according to an example embodiment. Referring to FIG. 14, the first to third LED light source units 30A, 30B and 30C may include different numbers of first to third LED light sources 130A, 130B and 130C, respectively. The first to third LED light sources 130A, 130B and 130C may be connected in series or in series/parallel in different manners.

As described above, the number of the first LED light sources 130A may be greater than the number of the second LED light sources 130B to maintain a constant light flux. The third LED light sources 130C may be used as auxiliary light sources for white light having an intermediate color temperature, and the number of the third LED light sources 130B may be less than the number of the second LED light sources 130B.

The first LED light sources 130A may include three strings in which light sources are connected in series, and the three strings may be connected to each other in parallel. The second LED light sources 130B may include two strings in which light sources are connected in series, and the two strings may be connected to each other in parallel. The third LED light sources 130C may include one string in which light sources are connected in series.

Respective strings of the first to third LED light sources 130A, 130B and 130C may include the same number of LED light sources connected in series. Thus, when the first to third LED light sources 130A, 130B and 130C have the same level of driving voltage, the first to third LED light source units 30A, 30B and 30C may be driven by the same level of applied current.

The first and third LED light sources 130A and 130C may be simultaneously driven by currents $I_1$ and $I_3$ respectively provided by the driving controlling unit, to emit white light having an intermediate color temperature.

The first LED light source 130A and the second LED light source 130B may be selectively driven, to provide first white light having a first color temperature or second white light having a second color temperature, and may provide white light having an intermediate color temperature. A color temperature of ultimately emitted light passing through the transparent encapsulant 160 may be lowered by a relatively high proportion of the light-scattering powder 165 employed in the example embodiment.

Figure 15:
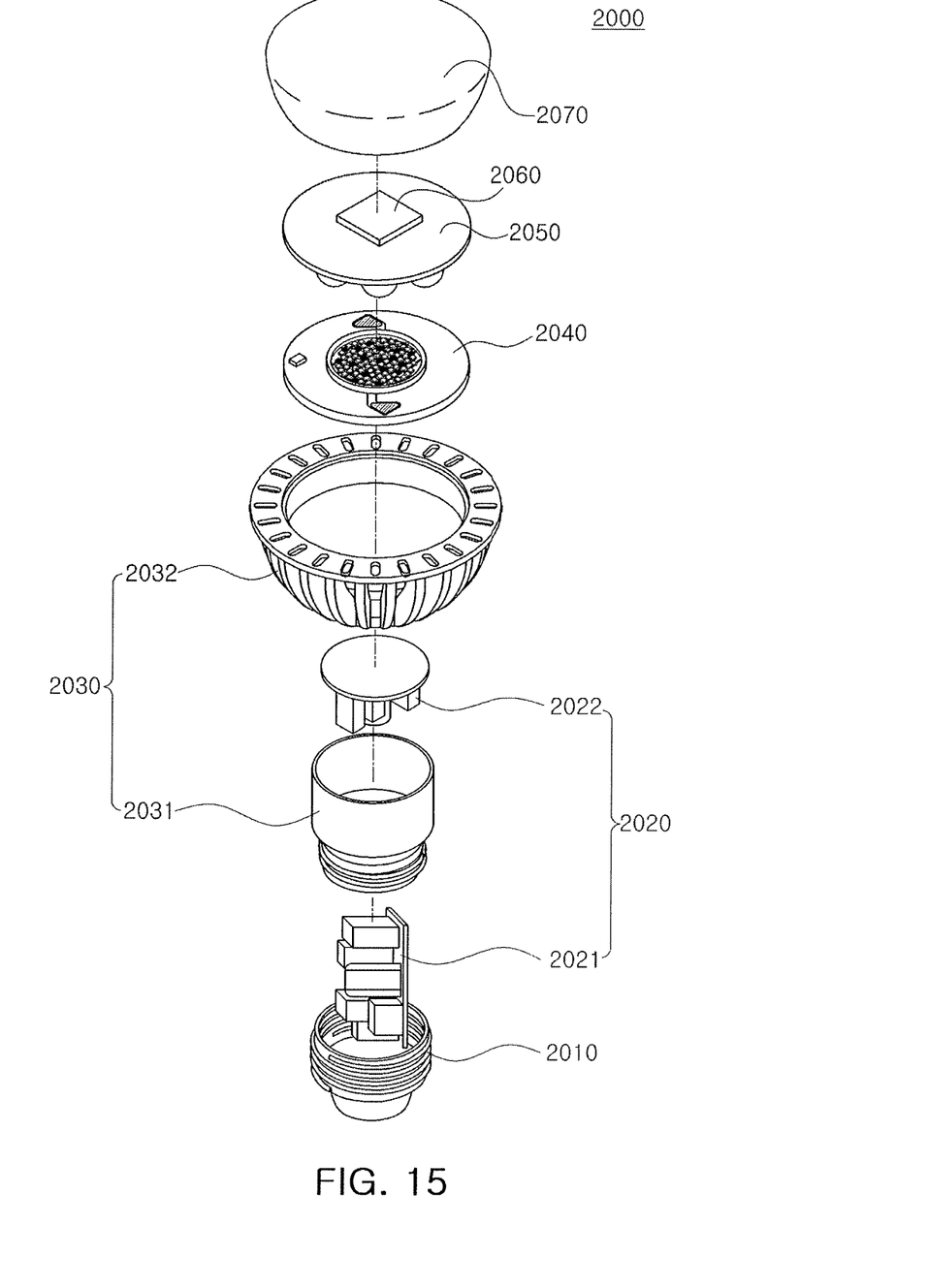
FIG. 15 illustrates an exploded perspective view schematically of a lamp-type lighting apparatus according to an example embodiment.

FIG. 15 is an exploded perspective view schematically illustrating a lamp-type lighting apparatus according to an example embodiment. Referring to FIG. 15, a lighting apparatus 2000 may include a bulb base 2010, a power supply unit 2020, a heat dissipation unit 2030, an LED module 2040 according to the example embodiments, and a cover unit 2070.

Power supplied to the lighting apparatus 2000 may be applied thereto, through the bulb base 2010. The bulb base 2010 may allow the LED module of embodiments to be substituted for an existing lighting apparatus. As illustrated in FIG. 15, the power supply unit 2020 may include a first power supply portion 2021 and a second power supply portion 2022 that are separated from or coupled to each other.

The heat dissipation unit 2030 may include an internal heat dissipation unit 2031 and an external heat dissipation unit 2032. The internal heat dissipation unit 2031 may be directly connected to the LED module 2040 and/or the power supply unit 2020, by which heat may be transferred to the external heat dissipation unit 2032. The cover unit 2070 may be configured to evenly distribute light emitted by the LED module 2040.

The LED module 2040 according to the example embodiment may be the LED module described above with reference to FIGS. 2 and 3. A reflective plate 2050 may be provided above the LED module 2040. The reflective plate 2050 may allow for uniform spreading of light from a light source sideways and backwards to reduce a glare effect of light.

A communications module 2060 may be mounted on an upper portion of the reflective plate 2050, and home-network communications may be implemented through the communications module 2060. For example, the communications module 2060 may be a wireless communications module using ZigBee®, Wi-Fi, Li-Fi, or the like, and may control illumination of lighting apparatuses, e.g., switching on/off, adjustment of brightness, or the like, through a smartphone or a wireless controller. In addition, electronic products in the home or outdoors and automobile systems, e.g., television sets, refrigerators, air conditioners, door locks, automobiles, or the like, may be controlled using a Li-Fi communications module that uses a visible light wavelength of a lighting apparatus installed indoors or outdoors. The reflective plate 2050 and the communications module 2060 may be covered by the cover unit 2070.

By way of summation and review, realizing a target color temperature in an intermediate range between that output by a warm light source and a cool light source may be difficult. Further, color staining may occur due to a white LED light source having a non-driven channel, thereby causing a deterioration in color quality. As set forth above, according to one or more example embodiments, a white LED module and a lighting apparatus may have improved color quality by preventing color unevenness due to a non-driven LED light source, by sufficiently including a light-scattering powder while easily adjusting a required color temperature.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A white light emitting diode (LED) module, comprising:
   a circuit board;
   at least one first LED light source on the circuit board, and emitting a first white light having a first color temperature;
   at least one second LED light source on the circuit board, and emitting a second white light having a second color temperature, higher than the first color temperature;
   a wiring structure in the circuit board, and to selectively drive the at least one first LED light source and the at least one second LED light source; and
   a transparent encapsulant on the circuit board, to cover the at least one first LED light source and the at least one second LED light source, the transparent encapsulant including a transparent resin and a light-scattering powder in the transparent resin, wherein the light-scattering powder is contained in the transparent encapsulant in an amount of 100% or more, based on the weight of the transparent resin.

2. The white LED module as claimed in claim 1, wherein a weight ratio of the light-scattering powder of the transparent encapsulant to the transparent resin of the transparent encapsulant ranges from 1:1 to 3:1.

3. The white LED module as claimed in claim 1, wherein the light-scattering powder is at least one of $SiO_2$, $Al_2O_3$, $TiO_2$, and silicone.

4. The white LED module as claimed in claim 1, wherein:
   the first white light passes through the transparent encapsulant to be emitted as a third white light having a third color temperature lower than the first color temperature, and
   the second white light passes through the transparent encapsulant, to be emitted as a fourth white light having a fourth color temperature lower than the second color temperature.

5. The white LED module as claimed in claim 4, wherein:
the third color temperature is lower than the first color temperature, by 100 K or more, and
the fourth color temperature is lower than the second color temperature, by 500 K or more.

6. The white LED module as claimed in claim 1, wherein the transparent encapsulant has a dome structure.

7. The white LED module as claimed in claim 1, further comprising a dam structure on the circuit board, the dam structure defining an extent of the transparent encapsulant.

8. The white LED module as claimed in claim 1, wherein the at least one first LED light source and the at least one second LED light source are provided as a plurality of first LED light sources and a plurality of second LED light sources, respectively, and a number of the first LED light sources is greater than a number of the second LED light sources.

9. The white LED module as claimed in claim 8, wherein:
the wiring structure includes a connection wiring connecting the plurality of respective first and second LED light sources in series or in series/parallel,
a common terminal commonly connected to first terminals of the plurality of first and second LED light sources, and
a first terminal and a second terminal connected to second terminals of the plurality of first and second LED light sources, respectively.

10. The white LED module as claimed in claim 8, wherein the plurality of first and second LED light sources are connected to be driven at a same level of voltage.

11. A white light emitting diode (LED) module, comprising:
a circuit board;
a plurality of first LED light sources on the circuit board, and emitting a first white light having a first color temperature;
a plurality of second LED light sources on the circuit board, and emitting a second white light having a second color temperature, higher than the first color temperature;
a plurality of third LED light sources on the circuit board, and emitting a third white light having a third color temperature higher than the first color temperature;
a wiring structure in the circuit board, and to respectively connect the plurality of first LED light sources, the plurality of second LED light sources and the plurality of third LED light sources in series or in series/parallel, and to selectively drive at least one of the plurality of first to third LED light sources; and
a transparent encapsulant on the circuit board, to cover the plurality of first to third LED light sources, the transparent encapsulant including a transparent resin and a light-scattering powder in the transparent resin, wherein the light-scattering powder is contained in the transparent encapsulant in an amount of 100% or more, based on the weight of the transparent resin.

12. The white LED module as claimed in claim 11, wherein color temperatures of the first to third white light after passing through the transparent encapsulant are lower than the first to third color temperatures, by 100 K or more, respectively.

13. The white LED module as claimed in claim 11, wherein:
the first color temperature ranges from 2700 K to 3200 K,
the second color temperature ranges from 4500 K to 5500 K,
the first white light is lower than the first color temperature by 100 K or more, when passing through the transparent encapsulant, and
the second white light is lower than the second color temperature by 500 K or more, when passing through the transparent encapsulant.

14. The white LED module as claimed in claim 11, wherein:
an average particle size of the light-scattering powder ranges from 1 µm to 5 µm, and
a weight ratio of the light-scattering powder to the transparent resin ranges from 2.2:1 to 2.6:1.

15. The white LED module as claimed in claim 11, wherein a number of the plurality of second LED light sources is less than a number of the plurality of first LED light sources.

16. The white LED module as claimed in claim 15, wherein the third color temperature is substantially equal to the second color temperature, and the number of the third LED light sources is less than the number of the second LED light sources.

17. The white LED module as claimed in claim 16, wherein mixed light of the first white light and the third white light has an intermediate color temperature between the first color temperature and the second color temperature, when the plurality of first LED light sources and the plurality of third LED light sources are simultaneously driven.

18. A lighting apparatus, comprising:
a lighting housing;
a white light emitting diode (LED) module mounted in the lighting housing; and
a driving controller controlling supply of a current to the white LED module,
wherein the white LED module includes,
a first channel on which L number of first LED light sources, emitting a first white light having a first color temperature, are connected,
a second channel on which M (L>M) number of second LED light sources, emitting a second white light having a second color temperature, higher than the first color temperature, are connected,
a third channel on which N (M>N) number of third LED light sources, emitting a third white light having an intermediate color temperature between the first color temperature and the second color temperature, are connected, and
a transparent encapsulant including a transparent resin and a light-scattering powder in the transparent resin, the transparent encapsulant covering the first to third LED light sources, and
wherein the driving controller is to selectively drive one of the first channel and the second channel or a combination of the first and third channels, and
wherein the light-scattering powder is contained in the transparent encapsulant in an amount of 100% or more, based on the weight of the transparent resin.

19. The lighting apparatus as claimed in claim 18, wherein color temperatures of the first white light and the second white light after passing through the transparent encapsulant are lower than the first color temperature and the second color temperature, by 100 K or more, respectively.

20. The white LED module as claimed in claim 18, wherein a weight ratio of the light-scattering powder of the transparent encapsulant to the transparent resin of the transparent encapsulant ranges from 1:1 to 3:1.

* * * * *